United States Patent
Koga et al.

(10) Patent No.: US 9,337,128 B2
(45) Date of Patent: May 10, 2016

(54) SEMICONDUCTOR DEVICE

(71) Applicant: ROHM CO., LTD., Kyoto (JP)

(72) Inventors: Akihiro Koga, Kyoto (JP); Taro Nishioka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/637,565

(22) Filed: Mar. 4, 2015

(65) Prior Publication Data

US 2015/0179554 A1    Jun. 25, 2015

Related U.S. Application Data

(60) Continuation of application No. 14/257,217, filed on Apr. 21, 2014, now Pat. No. 9,035,436, which is a continuation of application No. 13/930,670, filed on Jun. 28, 2013, now Pat. No. 8,742,552, which is a division of application No. 13/141,222, filed as application No. PCT/JP2009/006548 on Dec. 2, 2009, now Pat. No. 8,502,359.

(30) Foreign Application Priority Data

Dec. 22, 2008    (JP) ................................ 2008-326113

(51) Int. Cl.
*H01L 23/495*    (2006.01)
*H01L 23/31*    (2006.01)
(Continued)

(52) U.S. Cl.
CPC ...... *H01L 23/49503* (2013.01); *H01L 23/3107* (2013.01); *H01L 23/3114* (2013.01); *H01L 23/49* (2013.01); *H01L 23/4952* (2013.01); *H01L 23/49541* (2013.01); *H01L 23/49548* (2013.01); *H01L 24/42* (2013.01); *H01L 24/49* (2013.01); *H01L 24/48* (2013.01); *H01L 2224/48091* (2013.01); *H01L 2224/48106* (2013.01); *H01L 2224/48177* (2013.01);
(Continued)

(58) Field of Classification Search
CPC .............. H01L 23/495; H01L 23/4951; H01L 23/49503; H01L 23/49541; H01L 23/49548; H01L 23/49575; H01L 23/49805; H01L 23/3107
USPC .................. 257/666, 670, 672, 787, E23.004, 257/E23.043, E23.045, E23.046, E23.061
See application file for complete search history.

(56) References Cited

U.S. PATENT DOCUMENTS 5,550,402 A    8/1996    Nicklaus
7,741,704 B2    6/2010    Lange et al.
(Continued)

FOREIGN PATENT DOCUMENTS

JP    6-236958    8/1994
JP    08-222683 A    8/1996
(Continued)

*Primary Examiner* — Jasmine Clark
(74) *Attorney, Agent, or Firm* — Rabin & Berdo, P.C.

(57) ABSTRACT

A semiconductor device is disclosed. The semiconductor device has a semiconductor chip, an island having an upper surface to which the semiconductor chip is bonded, a lead disposed around the island, a bonding wire extended between the surface of the semiconductor chip and the upper surface of the lead, and a resin package sealing the semiconductor chip, the island, the lead, and the bonding wire, while the lower surface of the island and the lower surface of the lead are exposed on the rear surface of the resin package, and the lead is provided with a recess concaved from the lower surface side and opened on a side surface thereof.

22 Claims, 4 Drawing Sheets

(51) Int. Cl.
  *H01L 23/49* (2006.01)
  *H01L 23/00* (2006.01)
(52) U.S. Cl.
  CPC ... *H01L2224/48247* (2013.01); *H01L 2224/49* (2013.01); *H01L 2924/00014* (2013.01); *H01L 2924/01004* (2013.01)

(56) References Cited

U.S. PATENT DOCUMENTS

| | | | |
|---|---|---|---|
| 7,821,113 | B2 | 10/2010 | Sahasrabudhe et al. |
| 8,502,359 | B2 | 8/2013 | Koga et al. |
| 9,035,436 | B2 * | 5/2015 | Koga et al. ......... H01L 23/4952 257/666 |
| 2002/0149099 | A1 | 10/2002 | Shirasaka et al. |
| 2005/0106783 | A1 | 5/2005 | Miyata |
| 2006/0110857 | A1 | 5/2006 | Miyata |
| 2007/0001275 | A1 | 1/2007 | Shirasaka et al. |

FOREIGN PATENT DOCUMENTS

| | | |
|---|---|---|
| JP | 2001-015668 A | 1/2001 |
| JP | 2003-218284 A | 7/2003 |
| JP | 2005-150629 A | 6/2005 |
| JP | 2007-095788 A | 4/2007 |

* cited by examiner

SEMICONDUCTOR DEVICE

CROSS REFERENCE TO RELATED APPLICATION

This application is a continuation of application Ser. No. 14/257,217, now U.S. Pat. No. 9,035,436, filed on Apr. 21, 2014, which was a continuation of application Ser. No. 13/930,670, filed on Jun. 28, 2013, now U.S. Pat. No. 8,742,552, issued on Jun. 3, 2014, which was a divisional of application Ser. No. 13/141,222, filed on Sep. 1, 2011, now U.S. Pat. No. 8,502,359, issued on Aug. 6, 2013. Furthermore, this application claims the benefit of priority of PCT/JP2009/006548, filed on Dec. 2, 2009, and Japanese application 2008-326113, filed Dec. 22, 2008. The disclosures of these prior U.S. and Japanese applications are incorporated herein by reference.

TECHNICAL FIELD

The present invention relates to a surface-mounted semiconductor device.

BACKGROUND TECHNIQUE

The so-called non-leaded package eliminating extension of leads from a resin package and exposing the leads (outer leads) on the lower surface of the resin package is known as a surface mount package.

A semiconductor device employing the non-leaded package has a structure obtained by sealing a semiconductor chip with a resin package along with a lead frame. The lead frame is formed by punching a thin metal plate, and includes an island and a plurality of leads arranged around the island. The semiconductor chip is die-bonded to the upper surface of the island, and electrically connected with each lead by a bonding wire extended between the surface thereof and the upper surface of each lead. The lower surfaces of the island and each lead are exposed on the rear surface of the resin package.

PRIOR ART

Patent Document

Patent Document 1: Japanese Unexamined Patent Publication No. 2007-95788

SUMMARY OF THE INVENTION

Problem to be Solved by the Invention

In such a structure, each lead is held in the resin package only by bonding power between the upper surface and side surfaces thereof and the resin package. Therefore, the lead may come off the resin package.

Accordingly, an object of the present invention is to provide a surface-mounted semiconductor device capable of attaining improvement in bonding strength between a lead and a resin package.

Means for Solving the Problem

A semiconductor device according to the present invention for attaining the aforementioned object includes a semiconductor chip, an island having an upper surface to which the semiconductor chip is bonded, a lead arranged around the island, a bonding wire extended between the surface of the semiconductor chip and the upper surface of the lead, and a resin package collectively sealing the semiconductor chip, the island, the lead and the bonding wire, while the lower surface of the island and the lower surface of the lead are exposed on the rear surface of the resin package, and the lead is provided with a recess concaved from the lower surface side and opened on a side surface thereof.

In the semiconductor device, the lower surfaces of the island to which the semiconductor chip is bonded (die-bonded) and the lead electrically connected with the semiconductor chip by the bonding wire are exposed on the rear surface of the resin package collectively sealing the same. Therefore, the semiconductor device is surface-mountable on a wiring board.

The lead is provided with the recess concaved from the lower surface side thereof and opened on the side surface. The material for the resin package infiltrates into the recess, whereby part of a peripheral edge portion of the lead is held by the resin package from both of the upper and lower sides thereof. Thus, improvement in bonding strength between the lead and the resin package can be attained. Consequently, the lead can be prevented from coming off the resin package.

Preferably, the recess has a portion arcuately shaped in bottom plan view. According to this structure, the bonding strength between the lead and the resin package in all radial directions of the arcuate shape can be increased.

When, in a case of such a structure that a side surface of the lead is exposed on a side surface of the resin package, the recess is formed to be opened on the exposed side surface, for example, it is apprehended that the recess is blocked by a molding die for formation of the resin package and the material for the resin package does not infiltrate into the recess.

Therefore, the recess is preferably opened on a side surface of the lead opposed to the island. Thus, the recess is not blocked by the molding die and hence the material for the resin package can be reliably infiltrated into the recess, whereby the bonding strength between the lead and the resin package can be reliably improved.

The island may be quadrangularly shaped in bottom plan view, and the lead may be arranged on a portion opposed to each of four sides of the island in plan view, and provided in a shape having a side parallel to the opposed side. In this case, the recess is preferably opened on a side surface of each lead having a side opposed to each side of the island. Thus, the material for the resin package can be reliably infiltrated into the recess of each lead, whereby the bonding strength between each lead and the resin package can be reliably improved.

Preferably, the area of the recess in bottom plan view is not more than half the total area of the lower surface of the lead. With such a size of the recess, the bonding wire can be bonded to a relatively thick portion of the lead, while improvement in bonding strength between the lead and the resin package can be attained. Further, a contact area of the lead with respect to a wiring board can be sufficiently ensured.

Preferably, the lead has a side surface exposed on a side surface of the resin package, and a portion of the lead along the exposed side surface is provided with a recessed groove concaved from the lower surface side of the lead over the total width in a direction along the side surface. The material for the resin package also infiltrates into the recessed groove, whereby further improvement in bonding strength between the lead and the resin package can be attained.

MODE FOR CARRYING OUT THE INVENTION

Embodiments of the present invention are now described in detail with reference to the attached drawings.

Figure 1:
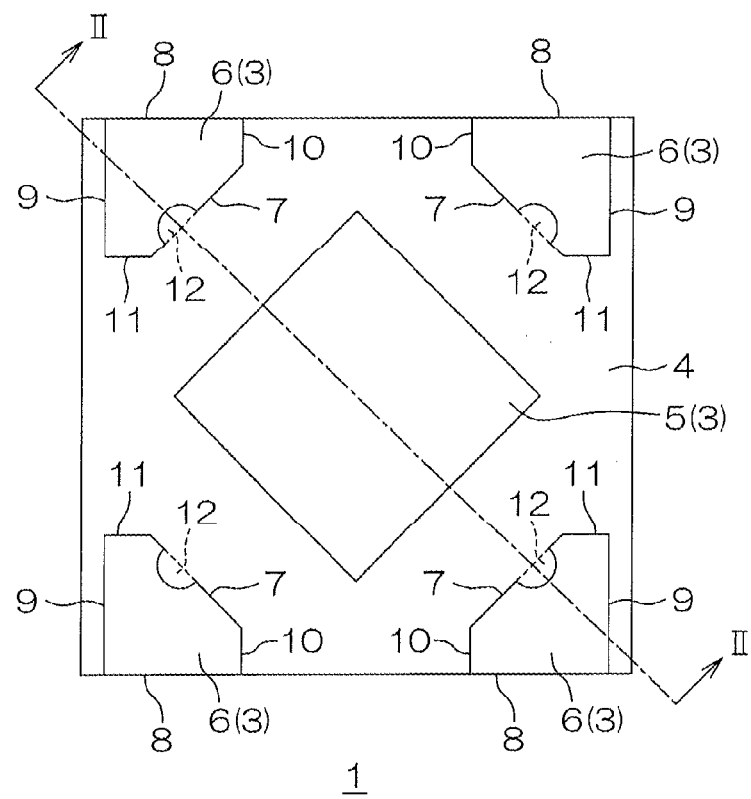
FIG. 1 is a bottom plan view of a semiconductor device according to a first embodiment of the present invention.
Figure 2:
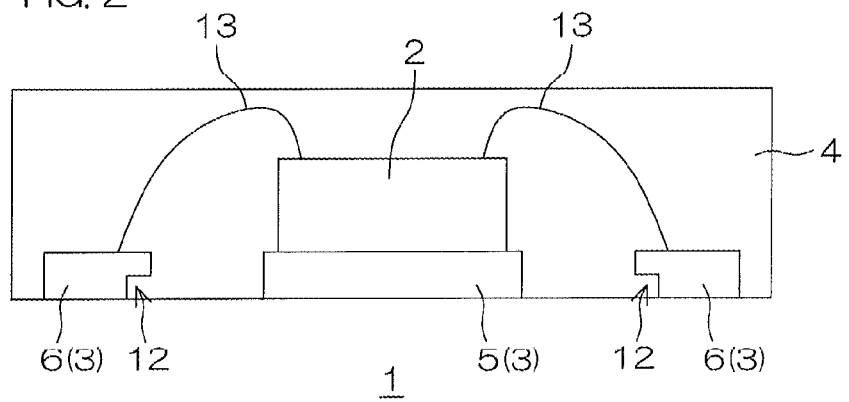
FIG. 2 is a schematic sectional view of the semiconductor device shown in FIG. 1 taken along a cutting plane line II-II.

FIG. 1 is a bottom plan view of a semiconductor device according to a first embodiment of the present invention. FIG. 2 is a schematic sectional view of the semiconductor device shown in FIG. 1 taken along a cutting plane line II-II.

A semiconductor device 1 has a structure obtained by sealing a semiconductor chip 2 with a resin package 4 along with a lead frame 3. The contour of the semiconductor device 1 is in the shape of a flat rectangular parallelepiped (a hexahedron square-shaped in plan view according to the embodiment).

The lead frame 3 is formed by punching a thin metal plate (a thin copper plate, for example), and includes an island 5 and four leads 6 arranged around the island 5.

The island 5 is quadrangularly shaped in plan view (square-shaped in plan view according to the embodiment). The lower surface of the island 5 is exposed on the rear surface of the resin package 4.

The leads 6 are arranged on portions opposed to the four sides of the island 5 respectively in bottom plan view. Each lead 6 is trapezoidally shaped in bottom plan view. More specifically, each lead 6 is provided in a shape having a side 7 parallel to the opposed side of the island 5, a side 8 extending on a side surface of the resin package 4, a side 9 orthogonal to the side 8 and extending parallelly to another side surface of the resin package 4, and sides 10 and 11 connecting the side 7 with the sides 8 and 9 respectively in plan view.

Each lead 6 is provided with a recess 12, semicircularly shaped in bottom plan view, concaved from the side of the lower surface (the exposed surface) of the lead 6 and opened on a side surface opposed to the island 5, i.e., the side surface having the side 7. The material for the resin package 4 infiltrates into the recess 12. The recess 12 can be formed by chemical etching or crushing, for example.

The lower surface of each lead 6 is exposed on the rear surface of the resin package 4 except the recess 12, to function as an external terminal for connection with a wiring board (not shown). The side surface of each lead 6 having the side 8 is exposed on the corresponding side surface of the resin package 4.

The rear surface of the semiconductor chip 2 is bonded (die-bonded) to the island 5 through a conductive bonding agent, in a state upwardly directing a surface (a device forming surface) on a side provided with functional elements. On the surface of the semiconductor chip 2, a pad (not shown) is formed by exposing part of a wiring layer from a surface protective film, correspondingly to each lead 6. An end of a bonding wire 13 is bonded to each pad. Another end of the bonding wire 13 is bonded to the upper surface of a relatively thick portion (a portion not provided with the recess 12) in each lead 6. Thus, the semiconductor chip 2 is electrically connected with the lead 6 through the bonding wire 13.

As hereinabove described, the lower surfaces of the island 5 and the leads 6 are exposed on the rear surface of the resin package 4. Therefore, the semiconductor device 1 is surface-mountable on the wiring board.

Each lead 6 is provided with the recess 12 concaved from the lower surface side thereof and opened on the side surface having the side 7. The material for the resin package 4 infiltrates into the recess 12, whereby the portion of each lead 6 provided with the recess 12 is held by the resin package 4 from both of the upper and lower sides thereof. Thus, improvement in bonding strength between each lead 6 and the resin package 4 can be attained. Consequently, the lead 6 can be prevented from coming off the resin package 4.

The recess 12 is opened on the side surface having the side 7, whereby the material for the resin package 4 can be reliably infiltrated into the recess 12.

Further, the recess 12 is semicircularly shaped in bottom plan view, whereby the bonding strength between the lead 6 and the resin package 4 in all radial directions of the arc thereof can be increased.

Figure 3:
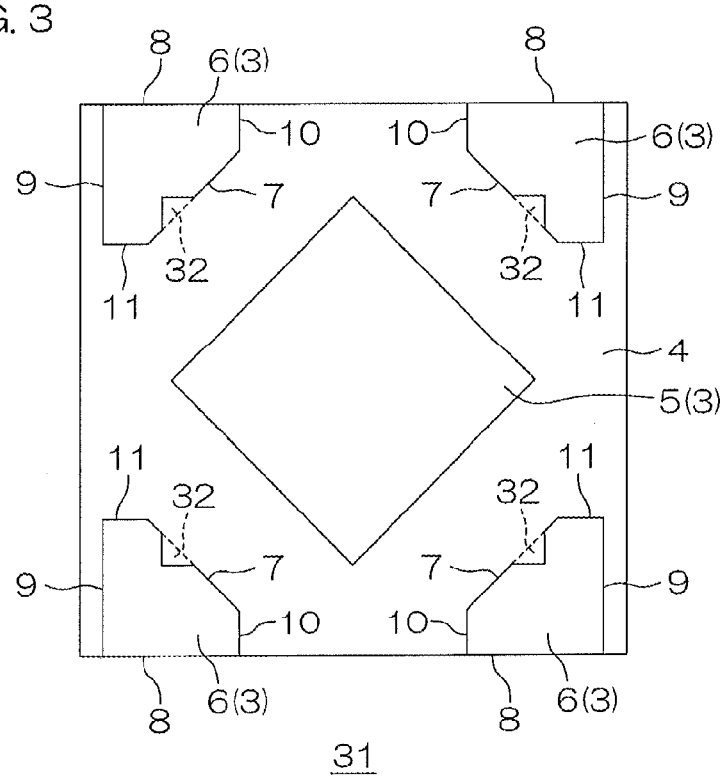
FIG. 3 is a bottom plan view of a semiconductor device according to a second embodiment of the present invention.

FIG. 3 is a bottom plan view of a semiconductor device according to a second embodiment of the present invention. Referring to FIG. 3, portions corresponding to those shown in FIG. 1 are denoted by the same reference signs as those assigned to the portions. In the following, only a point different from the structure shown in FIG. 1 is described as to the structure shown in FIG. 3, and description of the portions denoted by the same reference signs is omitted.

In a semiconductor device 31 shown in FIG. 3, each lead 6 is provided with a recess 32, right-triangularly shaped in bottom plan view, concaved from the lower surface side thereof and opened on a side surface having a side 7. The material for a resin package 4 infiltrates into the recess 32. The recess 32 can be formed by chemical etching or crushing, for example.

Also in this structure, improvement in bonding strength between each lead 6 and the resin package 4 can be attained. Consequently, the lead 6 can be prevented from coming off the resin package 4.

Figure 4:
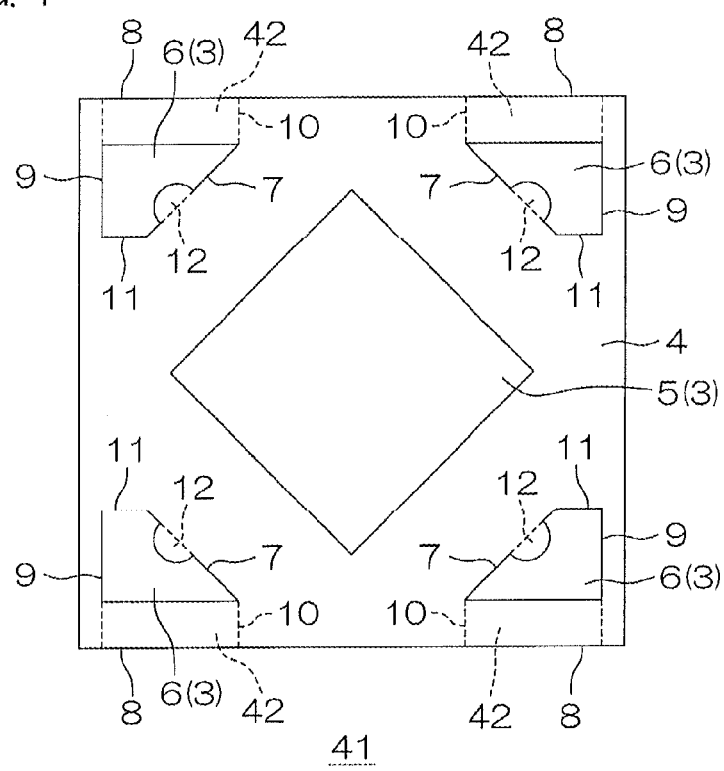
FIG. 4 is a bottom plan view of a semiconductor device according to a third embodiment of the present invention.

FIG. 4 is a bottom plan view of a semiconductor device according to a third embodiment of the present invention. Referring to FIG. 4, portions corresponding to those shown in FIG. 1 are denoted by the same reference signs as those assigned to the portions. In the following, only a point different from the structure shown in FIG. 1 is described as to the structure shown in FIG. 4, and description of the portions denoted by the same reference signs is omitted.

In a semiconductor device 41 shown in FIG. 4, a portion of each lead 6 having a side 8 is provided with a recessed groove 42 concaved from the lower surface side of each lead 6 over the total width in a direction along the side 8.

According to this structure, the material for a resin package 4 infiltrates into a recess 12 and the recessed groove 42, whereby further improvement in bonding strength between each lead 6 and the resin package 4 can be attained.

Figure 5:
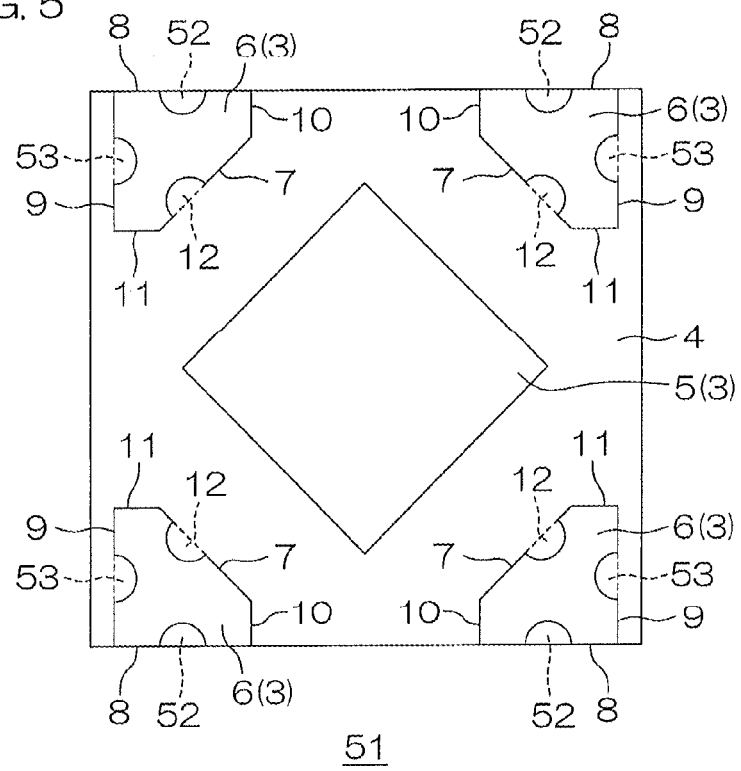
FIG. 5 is a bottom plan view of a semiconductor device according to a fourth embodiment of the present invention.

FIG. 5 is a bottom plan view of a semiconductor device according to a fourth embodiment of the present invention. Referring to FIG. 5, portions corresponding to those shown in FIG. 1 are denoted by the same reference signs as those assigned to the portions. In the following, only a point different from the structure shown in FIG. 1 is described as to the structure shown in FIG. 5, and description of the portions denoted by the same reference signs is omitted.

In a semiconductor device 51 shown in FIG. 5, each lead 6 is provided with recesses 12, 52 and 53, semicircularly shaped in bottom plan view, concaved from the lower surface side thereof and opened on side surfaces having sides 7, 8 and 9 respectively.

According to this structure, the material for a resin package 4 infiltrates into the recesses 12, 52 and 53, whereby further improvement in bonding strength between each lead 6 and the resin package 4 can be attained.

Figure 6:
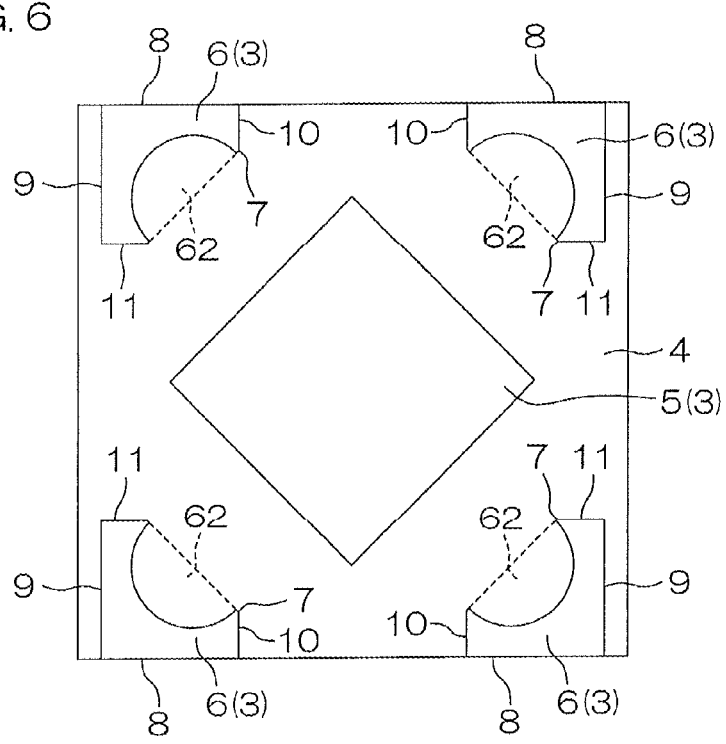
FIG. 6 is a bottom plan view of a semiconductor device according to a fifth embodiment of the present invention.

FIG. 6 is a bottom plan view of a semiconductor device according to a fifth embodiment of the present invention. Referring to FIG. 6, portions corresponding to those shown in FIG. 1 are denoted by the same reference signs as those assigned to the portions. In the following, only a point different from the structure shown in FIG. 1 is described as to the structure shown in FIG. 6, and description of the portions denoted by the same reference signs is omitted.

In a semiconductor device 61 shown in FIG. 6, each lead 6 is provided with a recess 62, semicircularly shaped in bottom plan view, having a size larger than that of the recess 12 shown in FIG. 1. The recess 62 is concaved from the lower surface side thereof, and opened on a side surface having a side 7. The area of the recess 62 in bottom plan view is about half the total area of the lower surface of the lead 6.

When the area of the recess 62 in bottom plan view is not more than half the total area of the lower surface of the lead 6, a bonding wire 13 can be bonded to a relatively thick portion of the lead 6, while improvement in bonding strength between the lead 6 and a resin package 4 can be attained. Further, a contact area of the lead 6 with respect to a wiring board can be sufficiently ensured.

Figure 7:
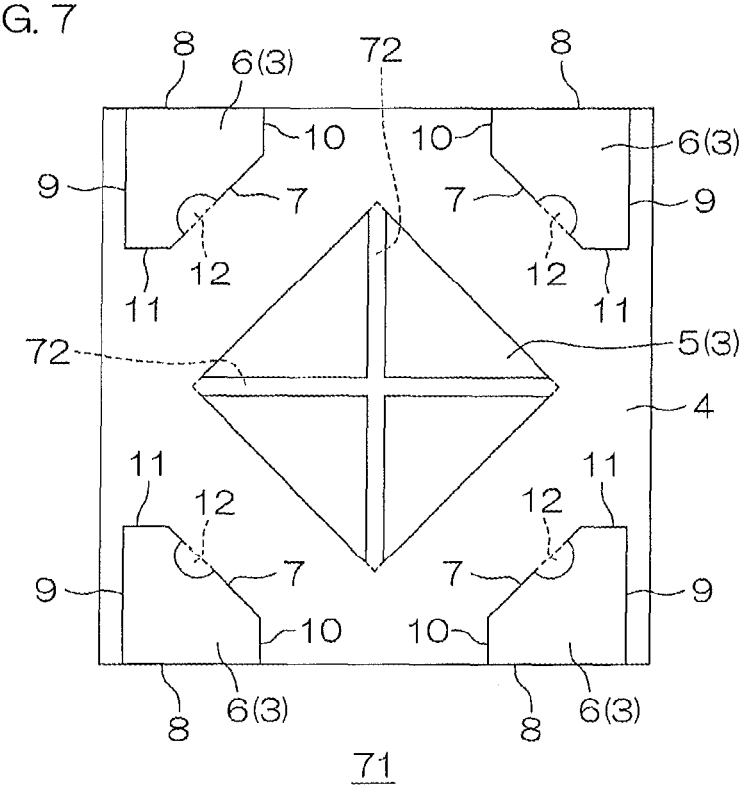
FIG. 7 is a bottom plan view of a semiconductor device according to a sixth embodiment of the present invention.

FIG. 7 is a bottom plan view of a semiconductor device according to a sixth embodiment of the present invention. Referring to FIG. 7, portions corresponding to those shown in FIG. 1 are denoted by the same reference signs as those assigned to the portions. In the following, only a point different from the structure shown in FIG. 1 is described as to the structure shown in FIG. 7, and description of the portions denoted by the same reference signs is omitted.

In a semiconductor device 71 shown in FIG. 7, an island 5 is provided with groovelike recesses 62 concaved from the lower surface side thereof and extending along two diagonal lines of the island 5 in bottom plan view. The material for a resin package 4 infiltrates into the recesses 72. The recesses 72 can be formed by chemical etching or crushing, for example.

The material for the resin package 4 infiltrates into the recesses 72, whereby portions of the island 5 provided with the recesses 72 are held by the resin package 4 from both of the upper and lower sides thereof. Thus, improvement in bonding strength between the island 5 and the resin package 4 can be attained. Consequently, the island 5 can be prevented from coming off the resin package 4.

While the first to sixth embodiments of the present invention have been described, the first to sixth embodiments may be properly combined and executed. For example, the first embodiment and the fourth embodiment may be so combined that one or two of the three recesses 12, 52 and 53 shown in FIG. 5 are semicircularly shaped in bottom plan view and the rest is right-triangularly shaped in bottom plan view. Further, the second embodiment and the third embodiment may be so combined that each lead 6 is provided with the recess 32 right-triangularly shaped in bottom plan view shown in FIG. 3 and the recessed groove 42 shown in FIG. 4.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

The invention claimed is:

1. A semiconductor device comprising:
   a semiconductor chip having an upper surface and a lower surface;
   an island having a lower surface, and an upper surface to which the semiconductor chip is bonded;
   a plurality of leads arranged around the island;
   for each lead, a bonding wire extending between the upper surface of the semiconductor chip and an upper surface of the lead; and
   a resin package sealing the semiconductor chip, the island, the plurality of leads and the bonding wires;
   wherein the leads on a lower surface of the resin package are adapted to allow the semiconductor device to be surface mounted;
   wherein, in bottom plan view, the island has an area defined by four sides, each of which is not parallel to any sides of the resin package, and for each side of said area of the island the angle between the side of the island and any of the sides of the resin package is less than a perpendicular angle;
   wherein at least two of the plurality of leads are arranged at respective corners of the semiconductor device in bottom plan view;
   wherein each of the plurality of leads has a side facing a respective one of the four sides of the area of the island, the side of the lead and the respective side of the island forming a facing pair of sides; and
   wherein one of the facing pairs includes a recess such that at least a portion of the respective side of the area of the island and at least a portion of the recess are non-parallel.

2. The semiconductor device according to claim 1, wherein the recessed portion is formed at a position apart from a corner of at least one of the leads.

3. The semiconductor device according to claim 1, wherein the recessed portion is arcuately shaped in bottom plan view.

4. The semiconductor device according to claim 1, wherein the recessed portion includes a portion infiltrated by the resin package to strengthen the attachment of the lead to the resin package.

5. The semiconductor device according to claim 4, wherein the infiltrated portion has a portion parallel to a lower surface of the semiconductor device.

6. The semiconductor device according to claim 4, wherein the infiltrated portion is held by the resin package from both of the upper and lower sides thereof.

7. The semiconductor device according to claim 4, wherein the infiltrated portion further covers the part of the resin package from a side thereof.

8. The semiconductor device according to claim 1, wherein the recessed portion is disposed at a center of the facing portion.

9. The semiconductor device according to claim 1, wherein both the side of the island and the side of at least one of the leads have a liner portion inclined with respect to a side of the resin package in bottom plan view.

10. A semiconductor device comprising:
    a semiconductor chip having an upper surface and a lower surface;
    an island having a lower surface, and an upper surface, the semiconductor chip being bonded to the upper surface of the island;
    at least one lead disposed around the island;

for each lead, a bonding wire extending between the upper surface of the semiconductor chip and an upper surface of the at least one lead; and a resin package sealing the semiconductor chip, the island, the at least one lead, and the bonding wire;

wherein the at least one lead on a lower surface of the resin package is adapted to allow the semiconductor device to be surface mounted;

wherein, in bottom plan view, the island has four sides, each of the four sides of the island not parallel to any side of the resin package, and for each side of said area of the island the angle between the side of the island and any of the sides of the resin package is less than a perpendicular angle;

wherein the at least one lead is disposed at a corner of the semiconductor device in bottom plan view;

wherein the at least one lead has a side facing one or more sides of the area of the island;

wherein at least one side of the area of the island and at least one side of the at least one lead face each other and form a facing portion; and wherein the facing portion includes a recess such that a portion of the at least one side of the area of the island and at least a portion of the recess are non-parallel.

11. The semiconductor device according to claim 10, wherein the recessed portion is formed at a position apart from a corner of the at least one lead.

12. The semiconductor device according to claim 10, wherein the recessed portion is arcuately shaped in bottom plan view.

13. The semiconductor device according to claim 10, wherein the recessed portion includes a portion infiltrated by the resin package to strengthen the attachment of the lead to the resin package.

14. The semiconductor device according to claim 13, wherein the infiltrated portion has a portion parallel to a lower surface of the semiconductor device.

15. The semiconductor device according to claim 13, wherein the infiltrated portion is held by the resin package from both of the upper and lower sides thereof.

16. The semiconductor device according to claim 13, wherein the infiltrated portion further covers the part of the resin package from a side thereof.

17. The semiconductor device according to claim 10, wherein the recessed portion is disposed at a center of the facing portion.

18. The semiconductor device according to claim 10, wherein both the side of the island and the side of the at least one lead have a liner portion inclined with respect to a side of the resin package in bottom plan view.

19. The semiconductor device according to claim 1, wherein at least three recessed portions are formed on one of the leads.

20. The semiconductor device according to claim 1, wherein the recessed portion is formed on each of at least two sides of one of the leads, respectively.

21. The semiconductor device according to claim 10, wherein at least three recessed portions are formed on one of the leads.

22. The semiconductor device according to claim 10, wherein the recessed portion is formed on each of at least two sides of one of the leads, respectively.

* * * * *